United States Patent [19]

Suzuki et al.

[11] Patent Number: 4,888,271
[45] Date of Patent: Dec. 19, 1989

[54] METHOD OF TREATING PHOTORESISTS

[75] Inventors: Shinji Suzuki, Kawasaki; Tetsuji Arai, Yokohama; Kazuyoshi Ueki, Kawasaki; Yoshiki Mimura, Yokohama; Hiroko Suzuki, Kawasaki, all of Japan

[73] Assignee: Ushio Denki, Tokyo, Japan

[21] Appl. No.: 146,926

[22] Filed: Jan. 22, 1988

[30] Foreign Application Priority Data

Mar. 24, 1987 [JP] Japan .................. 62-67888

[51] Int. Cl.[4] .............................................. G03C 5/16
[52] U.S. Cl. .................................... 430/328; 430/326
[58] Field of Search ....................... 430/326, 328, 330

[56] References Cited

U.S. PATENT DOCUMENTS 4,548,688 10/1985 Matthews ................. 204/159.18
4,749,436  6/1988 Minato et al. ................... 156/345

OTHER PUBLICATIONS

Matthews et al., "Stabilization of Single Layer and Multilayer Resist Patterns" . . . , Fusion Semiconductor Systems, SPIE Conf., Optical Mircolithography, 111, Calif., Mar. 14-15, 1984.
UV Hardening of Photo and Electron Beam Resist Patterns, J. Vac. Scl. Technol., 19(4), Nov./Dec. 1981.
High Temperature Flow Resistance of Micron Sized Images in AZ Resists, H. Hiraoka and J. Pacansky, IBM Research Laboratory, San Jose, Calif.
Deep U.V. Hardening of Positive Photoresist Patterns Journal of the Electrochemical Society, Jun. 1982.
Stabilization of Single Layer and Multilayer Resist Patterns to Aluminum Etching Environments, Fusion Semiconductor Systems, Mar. 1984.
Deep U.V. Hardening of Photo- and Electron Resist Patterns 1984, Dry Process Symposium, Matsushita Electronics Corporation.
Double Exposure Stabilization of Positive Photoresist Journal of Applied Polymer Science, vol. 30, 547-555, (1985).

Primary Examiner—Jose G. Dees
Attorney, Agent, or Firm—Armstrong, Nikaido, Marmelstein, Kubovcik & Murray

[57] ABSTRACT

Ultraviolet radiation process applies to manufacture semiconductor devices in order to enhance the thermal stability of the developed positive photoresist film on semiconductor wafers.

A method, in ultraviolet radiation process, and an apparatus enabling the high-speed and effective treatment of the positive photoresist empolying ultraviolet irradiation by preventing the deformation of the developed positive photoresist image which is caused by the light radiated from a discharge lamp such as high pressure mercury vapor lamp. These method and apparatus employ ultraviolet irradiation, in which ultraviolet rays are applied to the developed positive photoresist image, placed in a chamber filled with gas of lower pressure than 1 atmospheric pressure using a means to intercept or reduce selectively all or part of the wavelengths in the spectral response region of the positive photoresist out of radiant lights obtained from the discharge lamp.

2 Claims, 2 Drawing Sheets

METHOD OF TREATING PHOTORESISTS

BACKGROUND OF THE INVENTION

1. Field of the Invention

This invention relates to a method and an apparatus of treating positive photoresist materials applied on semiconductor wafer and, more particularly, to a method and an apparatus of treating the developed positive photoresist image on a semiconductor wafer placed in a chamber by employing ultraviolet irradiation.

2. Description of the Prior Art

As for the prior-art treatment of positive photoresist employing ultraviolet irradiation, exposing the photoresist to ultraviolet radiation is utilized in a treatment in which the same pattern as a mask pattern is formed on the photoresist film applied on a semiconductor wafer, etc., and recently attention has been paid to the application of this method to particular treatments such as the treatment of baking said photoresist film on a wafer.

The baking process is employed between a process of "forming a photoresist pattern, exposing and developing the photoresist" and a process of "executing ion implantation, plasma-etching, etc.", and said process is composed of a heating process executed for improving the adhesiveness of the photoresist to a semiconductor wafer and heat-resistance of said photoresist. While a reference of H. Hiraoka and J. Pacansky: J. Vac. Sci. Tech. 19(1981), and U.S. patent application Ser. No. 923,553 have disclosed a method in which ultraviolet rays are applied to the developed positive photoresist image after or during the baking process after "development process" so as to enhance the heat-resistance and plasma-resistance of the positive photoresist thorough the baking process in a shorter time.

When a light having a high ultraviolet intensity, such as a radiant light from a discharge lamp such as high pressure mercury vapor lamp having a high ultraviolet radiation efficiency, is applied to the developed positive photoresist film to expedite the treatment, however, gas is generated from the photoresist, and this gas causes the formation of bubbles, deformation of a photoresist pattern and breakdown of a photoresist film, such as exfoliation, rupture or roughening hereof, thus causing imperfections of a semiconductor device.

It can be supposed that the generation of this gas is caused by a rapid photochemical reaction of the light sensitive radicals of the photoresist materials, for instance, by the photochemical reaction of HMDS(hexamethyldisilazine), which is applied to a wafer as a preliminary treatment for the good coating of the photoresist onto a wafer or of an anti-reflection coating on the photoresist film, by the photochemical reaction of an additive materials to the photoresist materials such as dyestuff, by the photochemical reaction of a solvent remaining in the photoresist film.

These photochemical reactions are advanced remarkably by a light having a wavelength 300 nm to 500 nm, and more particularly, by a light having a wavelength in the spectral response region of the photoresist materials. Accordingly, when a discharge lamp such as a high pressure mercury vapor lamp radiating a light including these wavelength region is employed, it is not always to enhance the radiation light in order to shorten the time of treating the developed positive photoresist on a wafer. In other words, this apparatus has a problem that it cannot perform a high-speed treatment.

SUMMARY OF THE INVENTION

An object of this invention is to provide a method and an apparatus enabling the high-speed and effective treatment of the developed positive photoresist image prepared on a semiconductor wafer placed in a chamber employing ultraviolet irradiation by preventing the deformation of the photoresist image which is caused by the light radiated from the discharge lamp such as high pressure mercury vapor lamp.

In this invention, ultraviolet rays are applied to the developed positive photoresist image, using a means to intercept or reduce selectively all or any part of the wavelengths in the spectral response region of the positive photoresist out of radiant lights obtained from the discharge lamp such as high pressure mercury vapor lamp.

In this way, the photochemical reactions causing the generation of the gas from the positive photoresist are depressed and thus the deformation of the photoresist image is prevented, even when the discharge lamp such as high pressure mercury vapor lamp radiating strongly the light in the wavelength region exerting destructive actions on the photoresist image together with ultraviolet ways being effective for improving the heat-resistance and plasma-etching-resistance of the positive photoresist is employed, since the light in the wavelength region exerting the said destructive actions is not applied onto the photoresist image, placed in a chamber filled with gas of lower pressure than 1 atmospheric pressure or since the intensity of this light is sufficiently weak, even if it is applied.

Moreover, the light applied to the photoresist image still contains a strong ultraviolet component being effective for improving the heat-resistance and plasma-etching-resistance of the positive photoresist even when the wavelengths in the spectral response region of the positive photoresist are intercepted or reduced.

Accordingly, an invented a method enabling the high-speed and effective treatment of the developed positive photoresist image on a semiconductor wafer is accomplished.

Other objects and advantages of this invention will become apparent from the following description of the preferred embodiment of the invention, taken in conjunction with the accompanying drawings.

DESCRIPTION OF THE PREFERRED EMBODIMENT

This invention will be described concretely hereinafter on the basis of embodiments shown in accompanying drawings.

Figure 1:
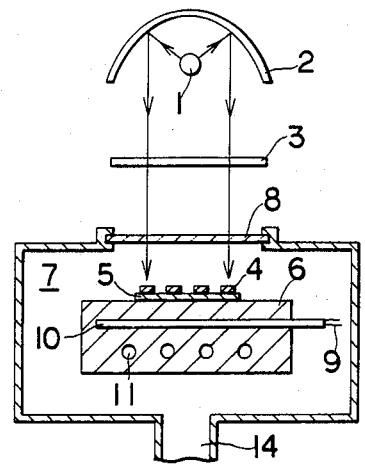
FIG. 1 shows an apparatus of treating a developed positive photoresist image for explaining one embodiment of a method of treating a developed positive photoresist image prepared on a semiconductor wafer according to this invention.

FIG. 1 shows an embodiment of an apparatus of treating a photoresist for explaining one embodiment of a method for treatments of developed positive photoresists prepared on a semiconductor wafer according to this invention.

A chamber 7 has a radiation window 8 formed of quartz glass at the top and an exhaust hole 14 at the bottom. The exhaust hole 14 is connected to a vacuum pump, not shown, which reduces the pressure of gas in the chamber 7 to approximately $1 \times 10^{-1}$ torr.

A pattern of a developed positive photoresist image 4 is formed on a semiconductor wafer 5, which is placed on a support 6. The support 6 is heated by a heater 10 connected with power supply through a heater lead wire 9. or cooled down by cooling water to flow through a cooling conduit 11. The temperature of the semiconductor wafer 5 is controlled by these heating and cooling mechanisms. Ultraviolet radiation source arranged on the upper part of the radiation window 8 is composed of a high pressure mercury vapor lamp 1, a concave mirror 2, a filter 3, etc..

Figure 3:
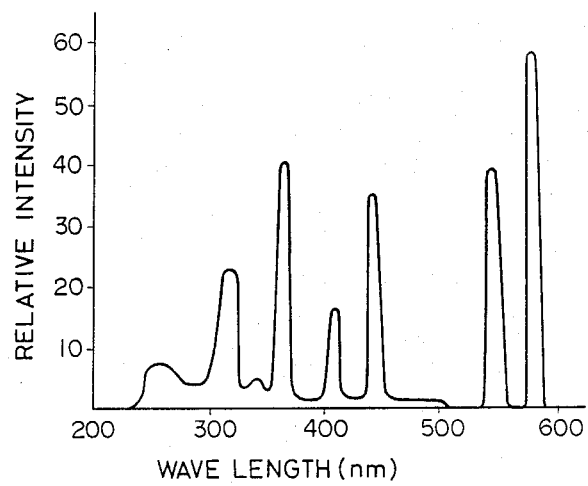
FIG. 3 shows one example of the radiation spectrum of the electrodeless discharge lamp employed in this invention.
Figure 4:
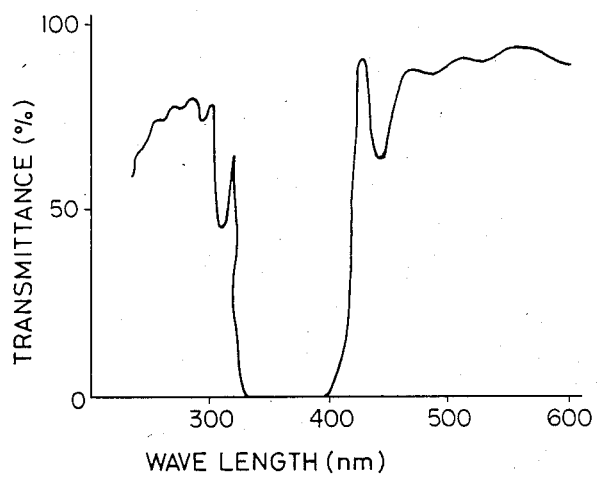
FIG. 4 shows one example of the spectral transmittance characteristics of the filter employed in this invention.

The radiant light from the high pressure mercury vapor lamp 1 is passed through the filter 3, etc. and applied to said photoresist image 4 on said wafer. FIG. 3 shows one example of the radiation spectrum of the high pressure mercury vapor lamp 1 employed in this embodiment. The filter 3 intercepting or reducing a light in the wavelength region of 300 nm to 500 nm, that is, a wavelength region including the wavelengths in the spectral response region of the positive photoresist, is employed herein, and thereby the treatment of the positive photoresist on a wafer employing ultraviolet irradiation and temperature control in a chamber filled with gas of lower than 1 atmospheric pressure can be performed effectively.

It is suitable to employ a filter prepared by forming a multilayer evaporation film on a glass plate for obtaining the characteristic of intercepting or reducing the light in the wavelength region of 300 nm to 500 nm. The glass plate preferable for this filter is of the fused silica, which is showing a large transmittance of ultraviolet rays of a wavelength 300 nm or below which are effective for the improvement in the heat-resistance and plasma-etching-resistance of the positive photoresist.

By using this apparatus, the radiant light from the high pressure mercury vapor lamp is applied to a sample which was prepared by using the novolak type positive photoresist which is 1.5 μm or more of thickness, and HMDS as an agent which is applied to a wafer as a preliminary treatment for the application of the said photoresist. While deformation which was caused by bubbles formation and/or distortion took place in said sample of photoresists when the aforesaid filter was not employed, no deformation of the photoresist occurred and the heat-resistance and plasma-etching-resistance of the photoresist image were improved when this filter was employed so as to intercept the light of 300 nm to 500 nm. A high pressure mercury vapor lamp radiates strongly the lights of the wavelength 312 nm, 365 nm, 405 nm and 436 nm. When this lamp and a narrow-band filter intercepting these light are employed, deformation of the developed positive photoresist image does not occur either.

Moreover, the photoresist image is treated by placing in gas of lower pressure than 1 atmospheric pressure, the time for treating photoresist image is shorten, which is 1/5 times in comparison with the time of treating same in the air of 760 torr.

Figure 2:
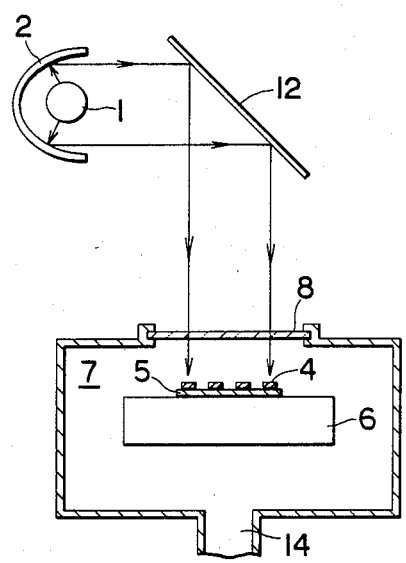
FIG. 2 shows another apparatus for explaining another embodiment.

FIG. 2 shows another embodiment in which a mirror is employed as a means to intercept or reduce the radiant light in a wavelength region of 300 nm to 500 nm. The mirror 12 employed herein has a characteristic of reflecting a radiant light in a wavelength region below 300 nm and not reflecting the radiant light of 300 nm to 500 nm. A mirror formed of a multilayer film evaporated on glass is suitable also for the mirror having the abovementionved mentioned characteristic. The same effect as in the apparatus illustrated in FIG. 1, in which the filter is employed, can be attained also in the apparatus illustrated in FIG. 2, in which the mirror having the said characteristic is employed. When a conventional mirror reflecting the all wavelength region of the radiant light from the high pressure mercury vapor lamp is employed instead of the mirror having the aforesaid characteristic, deformation took place in the aforesaid samples made of the positive photoresist.

In the above-mentioned embodiment, a high pressure mercury vapor lamp is used to get the high intensity radiation of ultraviolet lights. Another lamps can be used instead of this lamp. A metal-halide discharge lamp containing a filling comprised of a very small quantity of metal other than mercury in the form of a halide, for instance, may be used as well on condition that the lamp radiates ultraviolet rays of a ultraviolet wavelength region, and further mercury-rare gas discharge lamp containing a filling comprised of mercury and rare gas as the source radiating a ultraviolet wavelength region may also be employed.

In addition to the above-described embodiments, the filter or the mirror is employed separately as a means to intercept or reduce the light having the wavelengths in the spectral response region of the positive photoresist. It is a matter of course that a various combination of different filters and mirrors may be employed.

We claim:

1. A method of enhancing thermal stability of a developed positive photoresist image on a semiconductor wafer comprising the steps of:

energizing a discharge lamp with electrodes to provide a range of radient energy including wavelengths of 300 nm to 500 nm, selectively filtering wavelengths in the spectral response region of said photoresist image from said radiant energy, placing the developed positive photoresist image in a chamber having a gas at a pressure lower than $1 \times 10 - 1$ torr atmospheric pressure, and exposing said photoresist image to the wavelengths remaining in said radiant energy after filtering step.

2. The method defined by claim 1 wherein said gas is air and said discharge lamp is a mercury vapor lamp.

* * * * *